United States Patent
Colavito et al.

(10) Patent No.: US 6,624,486 B2
(45) Date of Patent: Sep. 23, 2003

(54) METHOD FOR LOW TOPOGRAPHY SEMICONDUCTOR DEVICE FORMATION

(75) Inventors: David B. Colavito, Rock Hill, NY (US); Nivo Rovedo, Lagrangeville, NY (US); Phung T. Nguyen, Pleasant Valley, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/864,033

(22) Filed: May 23, 2001

(65) Prior Publication Data

US 2002/0175369 A1 Nov. 28, 2002

(51) Int. Cl.$^7$ ................................. H01L 29/76
(52) U.S. Cl. ....................... 257/396; 257/622
(58) Field of Search ................... 257/306, 375, 257/396, 622, 623; 438/269, 183, 300; 148/DIG. 116

(56) References Cited

U.S. PATENT DOCUMENTS

| | | | |
|---|---|---|---|
| 3,861,968 A | 1/1975 | Magdo et al. | |
| 3,883,372 A | 5/1975 | Lin | |
| 3,975,752 A | 8/1976 | Nicolay | |
| 4,830,975 A | * 5/1989 | Bovaird et al. | ..... 148/DIG. 116 |
| 5,275,963 A | 1/1994 | Cederbaum et al. | |
| 5,408,116 A | * 4/1995 | Tanaka et al. | ............... 257/306 |
| 5,563,096 A | 10/1996 | Nasr | |
| 5,578,854 A | 11/1996 | Chen et al. | |
| 5,627,393 A | 5/1997 | Hsu | |
| 6,064,092 A | 5/2000 | Park | |
| 6,104,060 A | 8/2000 | Hshieh et al. | |
| 6,114,726 A | 9/2000 | Barkhordarian | |
| 6,372,583 B1 | * 4/2002 | Tyagi | ........................ 438/269 |
| 6,406,951 B1 | * 6/2002 | Yu | .............................. 438/183 |

* cited by examiner

*Primary Examiner*—William David Coleman
(74) *Attorney, Agent, or Firm*—Margaret Pepper; Cantor Colburn LLP

(57) ABSTRACT

A method for forming a planarized field effect transistor (FET) is disclosed. In an exemplary embodiment of the invention, the method includes defining an active semiconductor region upon a substrate, the active semiconductor region further comprising a pair of mesa regions therein. A source region is defined within a top surface of one of the pair of mesa regions, and a drain region is defined within a top surface of the other of the pair of mesa regions. Then, a gate material is deposited between the pair of mesa regions, and the gate material is planarized to form a gate. Thereby, a top surface of the gate is substantially planar with the source and drain regions.

10 Claims, 4 Drawing Sheets

METHOD FOR LOW TOPOGRAPHY SEMICONDUCTOR DEVICE FORMATION

BACKGROUND

The present invention relates generally to semiconductor processing and, more particularly, to low topography device formation prior to contact etching.

In the manufacture of semiconductor devices such as MOSFETS, making reliable electrical contact thereto is one of the more difficult processes. Such sub-micron devices are typically fabricated and isolated within a single-crystal substrate, and are further insulated by techniques such as shallow trench isolation (STI), dielectric deposition, or by growing an oxide layer on the top surface of the substrate. Once fabricated, these individual devices are then interconnected to form integrated circuits. Accordingly, electrical connections are made by etching holes or vias through the insulating layer and then by depositing high conductivity, thin-film metal structures within the vias, which metal structures are intended to make contact with the underlying devices.

However, given the topography or height differential between various device regions, it becomes difficult to accurately control the depth of the etching process. For example, when a dielectric layer (or stack) is deposited atop a formed polysilicon gate, the dielectric is then usually planarized such as by chemical mechanical polishing (CMP). Then, contact openings are patterned by photolithography techniques for etching thereafter. Because the top of the polygate is raised above the source and drain regions, the etching depth from the top of the dielectric to the top of the polygate is less than the etching depth from the top of the dielectric to the source and drain regions.

As a result, an increased device topography narrows the timing window for the etching process. If the etching is stopped prematurely, the openings over the source and drain regions may not be completely formed, thereby causing "opens" in the device. On the other hand, if the etching duration is too long, there may be an overetching of the polygate opening. This, in turn, may cause damage to the gate itself. In either case, the result is adverse since there is a reduction in overall device yield.

SUMMARY

The above discussed and other drawbacks and deficiencies of the prior art are overcome or alleviated by a method for forming a planarized field effect transistor (FET). In an exemplary embodiment of the invention, the method includes defining an active semiconductor region upon a substrate, the active semiconductor region further comprising a pair of mesa regions therein. A source region is defined within a top surface of one of the pair of mesa regions, and a drain region is defined within a top surface of the other of the pair of mesa regions. Then, a gate material is deposited between the pair of mesa regions, and the gate material is planarized to form a gate. Thereby, a top surface of the gate is substantially planar with the source and drain regions.

In a preferred embodiment, the active semiconductor region is formed by forming an insulating layer upon the substrate, which substrate comprises a single crystalline material. Then, a pair of window openings is formed within the insulating layer and an epitaxial layer is grown over the insulating layer and the pair of window openings, wherein the pair of mesa regions are formed over the pair of window openings. Preferably, the substrate further comprises single crystalline silicon, while the epitaxial layer comprises single crystalline silicon where it is grown over the pair of window openings.

BRIEF DESCRIPTION OF THE DRAWINGS

Referring to the exemplary drawings wherein like elements are numbered alike in the several Figures.

DETAILED DESCRIPTION

Figure 1A:
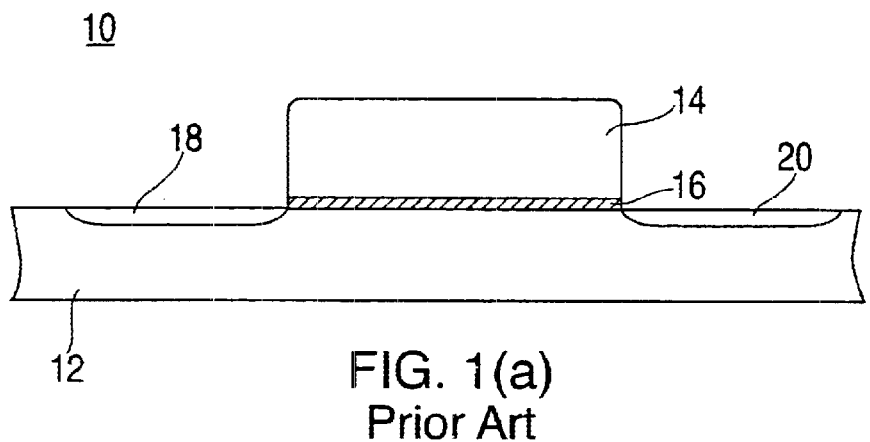
FIGS. 1(a)–(b) illustrate a contact etching process for an existing field effect transistor (FET) structure.
Figure 1B:
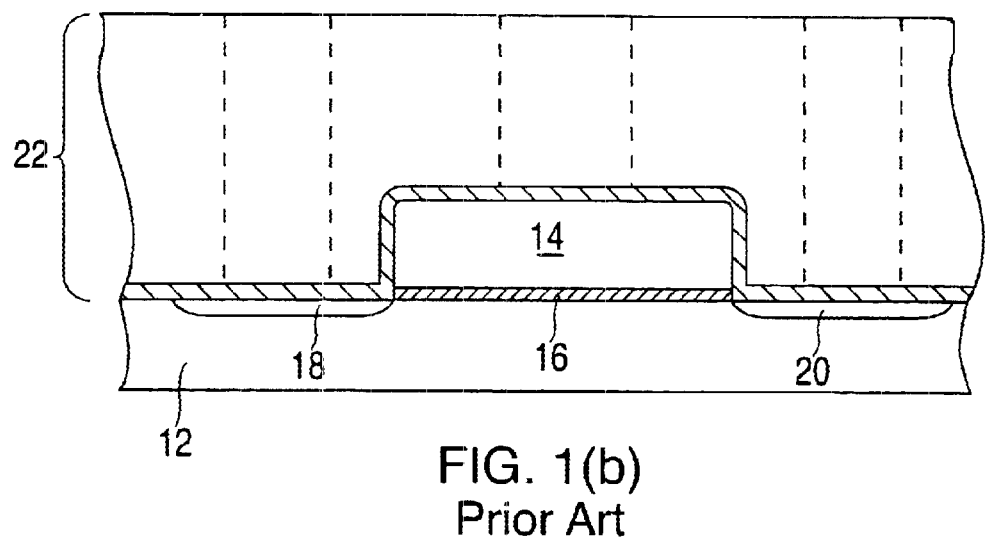

Referring initially to FIGS. 1(a)–(b), a contact etching process for an existing field effect transistor (FET) structure is illustrated. In particular, FIG. 1(a) shows a FET 10 formed atop a semiconductor substrate 12. The FET 10 includes a gate 14, formed upon a thin gate dielectric layer 16. The gate 14, for example, may be a polysilicon gate patterned and etched from a polysilicon layer (not shown). A source region 18 and a drain region 20 are also formed within substrate 12, such as by ionically implanting a dopant material into patterned regions within the substrate 12. A thermal annealing process may also be used to diffuse the dopant material within the source and drain region, as well as to repair any damage thereto caused by the implant process.

In FIG. 1(b), a dielectric stack 22 is deposited upon the FET 10 and then planarized, such as by chemical mechanical polishing. It will be noted at this point that the gate 14, as conventionally formed upon substrate 12, creates a step height in the topography of the FET 10. Thus, after the dielectric stack 22 is planarized, it will be seen that there is a differential in the etch depth required in order to create contact openings (vias) from the top of the stack 22 down to the gate, source and drain regions. This is illustrated by dotted lines, which indicate the areas of dielectric stack 22 to be etched away in order to establish electrical contact to the FET 10 terminals.

In a conventional FET fabrication process, the thickness of the gate may be for example on the order of about 1500 Å to about 3000 Å. Therefore, an additional 1500 Å–3000 Å in dielectric material depth must be etched before the contact openings to the source and drain regions are completed. Because the contact openings for the gate, source and drain regions are typically formed concurrently, there is a small tolerance or window for the duration of the etching process. Again, if the etching process is stopped prematurely, the contact openings for the source and drain regions are incomplete, resulting in an open circuit condition. Conversely, if the etching process is carried out too long, the gate 14 may be damaged by over etching.

Figure 2A:
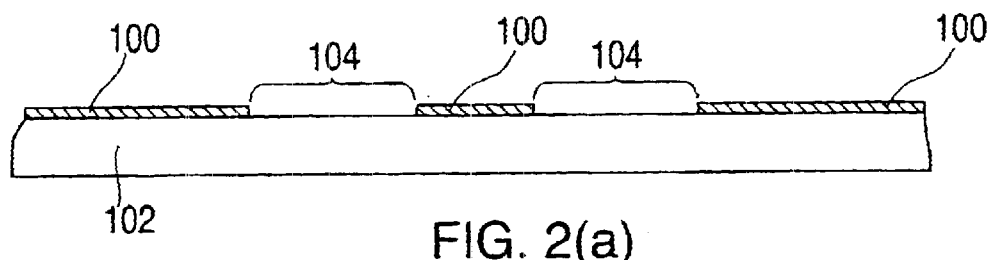
FIGS. 2(a)–(g) illustrate a method for forming a low topography semiconductor device, in accordance with an embodiment of the invention.
Figure 2B:
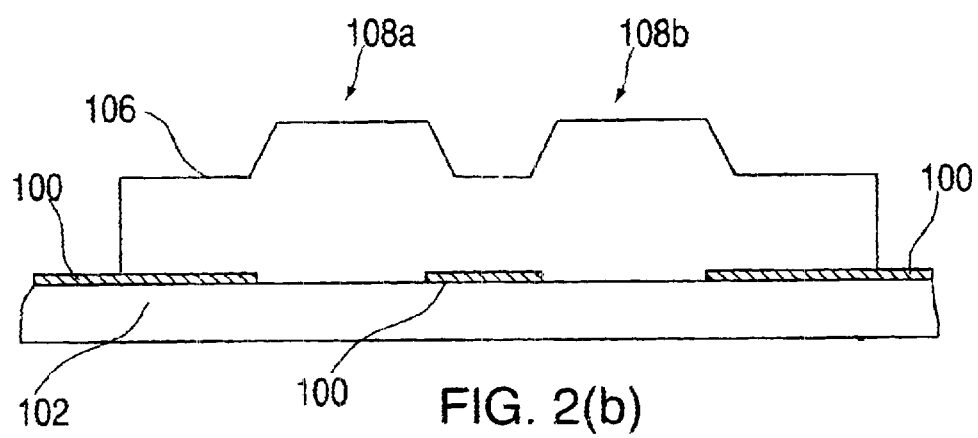

Therefore, in accordance with an embodiment of the invention, FIGS. 2(a)–(g) illustrate a method for forming a planarized field effect transistor FET, wherein there is a resulting uniformity in the planarity of the device terminals and, accordingly, a larger etching window. Specifically, in FIG. 2(a), a dielectric pad layer 100 or insulating layer is first formed upon a single crystalline substrate 102. In the example shown, the starting substrate 102 is silicon oriented in the <100> crystal plane. However, other substrate materials, such as a silicon germanium (SiGe) alloy or a silicon carbide alloy, may be used. Then, a pair of window openings 104 are patterned and opened within the pad layer 100. Window openings 104 may be patterned by existing photolithography techniques and opened by techniques such as wet or dry etching. It will be appreciated that the spacing between window openings can be varied in order to control device resistance. Once the window openings 104 are formed, an epitaxial layer 106 (e.g., silicon) is epitaxially grown over the pad layer 100 and window openings 104, as shown in FIG. 2(b).

In those areas over substrate 102 where the pad layer 100 is present, the epitaxial growth process results in either polycrystalline silicon growth or amorphous silicon growth, depending upon the particular process conditions. However, in those areas over substrate 102 where the window openings 104 are formed, the epitaxial growth process results in single crystalline growth. This, in turn, produces a pair of mesa regions 108a, 108b over window openings 104. Mesa regions, 108a, 108b, being comprised of single crystalline silicon, are thicker than the remaining portions of epitaxial layer 106 in polycrystalline (or amorphous) form. Depending upon the particular process conditions, the growth rate of single crystalline silicon is about 1.8 times the growth of polycrystalline silicon. Thus, a representative height of mesa regions 108a, 108b may be about 3,600 Å, while the corresponding thickness of the polycrystalline growth may be about 2,000 Å. However, it will be appreciated that these dimensions are exemplary only and are not to be construed in any limiting sense. Moreover, specific conditions of the epitaxial process can also be used to control the doping profile of epitaxial layer 106 in order to control the electrical properties of the resultant device.

While in a preferred embodiment, the substrate 102 is a single crystalline material, it will be appreciated that mesa regions 108a, 108b could also be formed directly over a single crystal grain oriented in the <100> plane, in an otherwise polycrystalline substrate. In this instance, window openings 104 would be smaller than (and positioned directly over) a single crystal grain.

Other materials may also be used for the epitaxial layer 106 (e.g., SiGe alloys or silicon carbide alloys). However, if an alloy such as SiGe (for example) is used, then that alloy should be sufficiently lattice-matched such that a single crystalline structure having stable electrical properties is grown over window openings 104. Furthermore, it will also be noted that substrate 102 and epitaxial layer 106 need not be comprised of the same material. As one example, the substrate 102 may be a SiGe alloy and epitaxial layer 106 may be pure silicon.

Figure 2C:
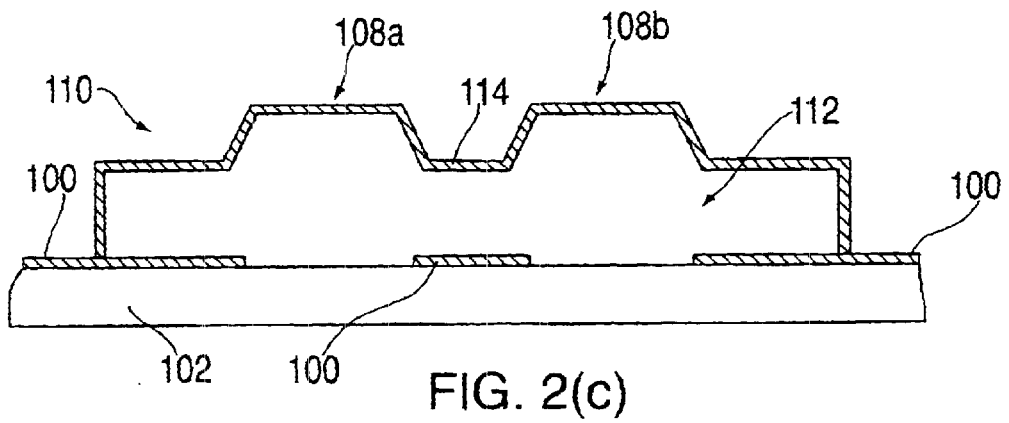

Referring now to FIG. 2(c), an active semiconductor region 110 is defined by patterning and etching, by photolithography techniques, a block 112 of the epitaxial layer 106, including the mesa regions 108a, 108b therein. Thus defined, block 112 is isolated from other active device areas formed on substrate 102. Then, a gate dielectric material, such as silicon dioxide (gate oxide), is used to form gate dielectric layer 114 atop block 112. The gate dielectric layer 114 is relatively thin, and may range from about 20 angstroms (Å) to about 100 Å, and may be formed with conventional thermal processing techniques. However, other thicknesses and materials (e.g., silicon oxynitride) may also be used for the gate dielectric layer 114.

Figure 2D:
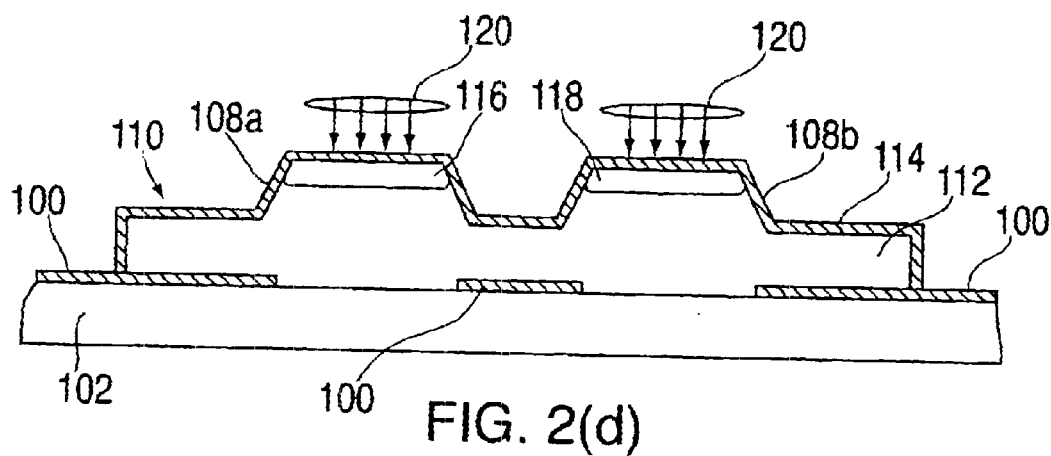

In FIG. 2(d), the definition of the source 116 and drain 118 regions is illustrated. The source region 116 is defined within the top surface of one of the mesa regions 108a, while the drain region 118 is defined on the top surface of the other mesa region 108b. The source and drain regions 116, 118 may be defined by such techniques as creating open regions within a block of photoresist (not shown). Afterward, the source and drain regions 116, 118 are ionically implanted with dopant material, as indicated by arrows 120, and the remaining resist is stripped away. It will also be appreciated, although not shown, that a similar scheme could be used to further control device resistance through implantation of dopant material into the regions of epitaxial layer 106 located directly above dielectric pad layer 100.

Figure 2E:
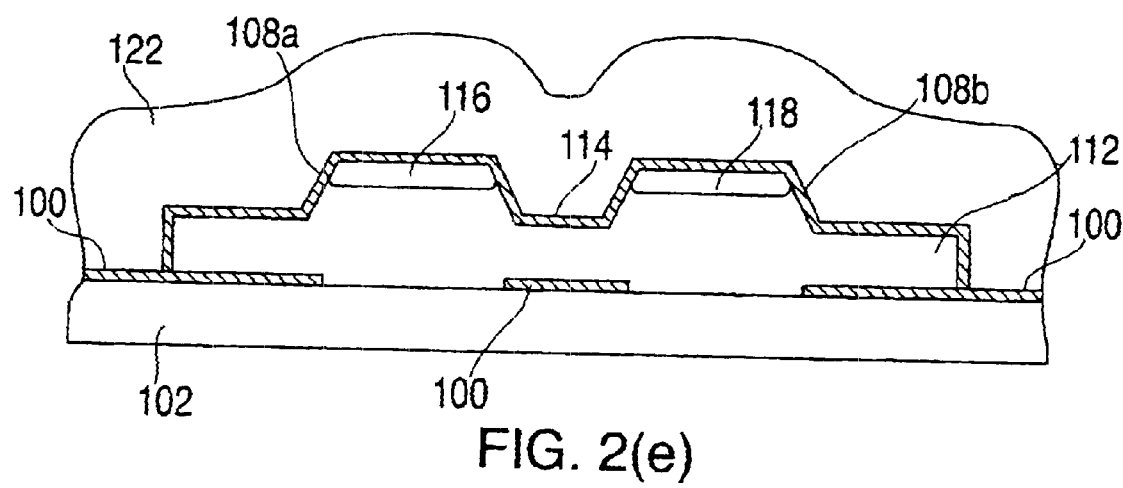
Figure 2F:
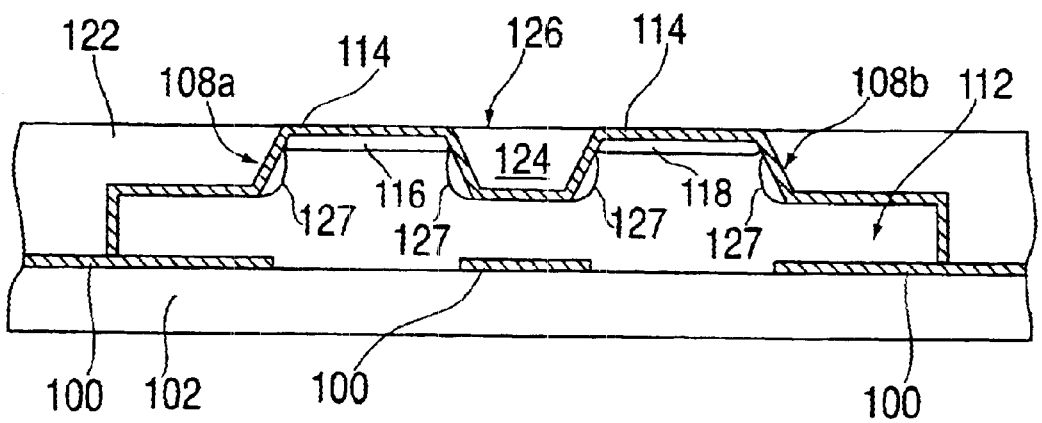
Figure 2G:
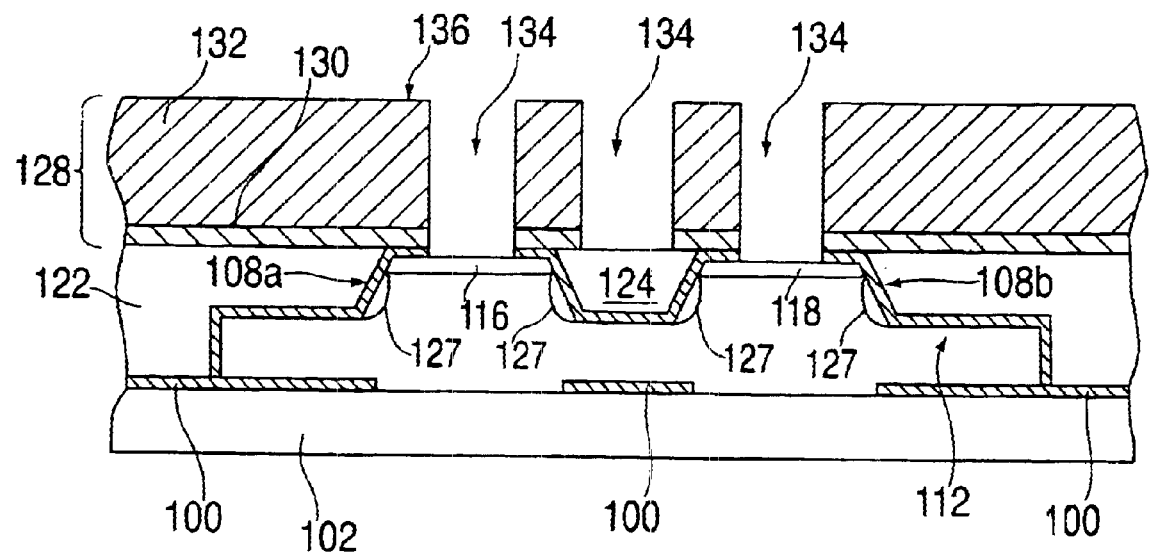

Next, in FIG. 2(e), a gate material 122, preferably doped polysilicon, is deposited over the block 112. However, other suitable conductive materials may also be used for the gate material. In particular, the polysilicon gate material 122 is deposited between mesas 108a and 108b, where the gate is to be formed. Then, the gate material 122 is planarized (e.g., by chemical mechanical polishing) all the way down to the gate oxide 114 atop mesas 108a and 108b. This is shown in FIG. 2(f). As a result, a gate 124 is thereby formed, which gate 124 is trapezoidal in shape. It will be appreciated at this point that the gate 124, thus formed, has a top surface 126 which is substantially planar with the source and drain regions 116, 118.

A thermal annealing process distributes the dopant species within the source and drain regions 116, 118 in order to establish electrical connections and link up the device to active channel regions 127. The annealing process may be carried out as a batch wafer process (e.g., in a furnace) or as a single wafer process (e.g., a rapid thermal process). In addition, an anneal serves to repair crystallographic damage caused during the ion implantation process.

Finally, the advantages of the aforementioned planarized FET structure are appreciated by reference to FIG. 2(f). Prior to establishing electrical contacts for the source 116, drain 118 and gate 124 areas, a dielectric stack 128 is deposited thereon. In the embodiment shown, the dielectric stack 128 includes a nitride layer 130 followed by a thicker layer 132 of borosilicate phosphorous glass (BSPG). Then, the contact openings for each area are defined by photolithography, followed by etching of the dielectric stack 128, and thereby forming contact openings or vias 134. Because the vias 134 for each of the source 116, drain 118 and gate 124 areas are etched at about the same depth (starting from the top 136 of BSPG layer 132), the greater the leeway in the etching timing window becomes.

As a result of the low topography FET formation, as described above, the yield loss due contact etching is improved. By taking advantage of the differential growth rates of single crystalline and polycrystalline (or amorphous) semiconducting material, a gate may be formed between raised source and drain regions, thereby providing a planar device topography prior to the contact etch process. While the invention has been described with reference to a preferred embodiment, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A planarized field effect transistor (FET) comprising:
   an active semiconductor region defined upon a substrate, said active semiconductor region further comprising a pair of mesa regions therein;

a source region defined within a top surface of one of said pair of mesa regions;

a drain region defined within a top surface of the other of said pair of mesa regions;

a gate deposited between said pair of mesa regions, wherein a top surface of said gate is substantially planar with said source and drain regions;

an insulating layer formed upon said substrate;

a pair of window openings formed within said insulating layer; and an epitaxial layer grown over said insulating layer and said pair of window openings;

wherein said pair of mesa regions are formed over said pair of window openings.

2. The planarized FET of claim 1, wherein said insulating layer further comprises a dielectric pad layer deposited upon said substrate.

3. The planarized FET of claim 2, wherein said substrate further comprises single crystalline material beneath said pair of window openings.

4. The planarized FET of claim 3, wherein:

said substrate further comprises single crystalline silicon; and said epitaxial layer comprises single crystalline silicon where said epitaxial layer is grown over said pair of window openings.

5. The planarized FET of claim 4, wherein said epitaxial layer comprises polycrystalline silicon where said epitaxial layer is grown over said dielectric pad layer.

6. The planarized FET of claim 4, wherein said epitaxial layer comprises amorphous silicon where said epitaxial layer is grown over said dielectric pad layer.

7. The planarized PET of claim 1, further comprising: a gate dielectric layer formed upon said active semiconductor region.

8. The planarized FET of claim 7, wherein said gate dielectric layer comprises a gate oxide.

9. The planarized FET of claim 7, wherein said gate is planarized down to portions of said gate oxide layer formed upon said pair of mesa regions.

10. The planarized FET of claim 7, further comprising:

a dielectric stack formed over said active semiconductor region;

said dielectric stack being planarized prior to the formation of contact openings therein.

* * * * *